United States Patent
Jeong et al.

(10) Patent No.: US 11,362,377 B2
(45) Date of Patent: Jun. 14, 2022

(54) CYLINDRICAL SECONDARY BATTERY HAVING PIEZOELECTRIC ELEMENT DISPOSED THEREIN

(71) Applicant: LG Chem, Ltd., Seoul (KR)

(72) Inventors: Min Gi Jeong, Daejeon (KR); Joo Hwan Sung, Daejeon (KR); Han Sol Park, Daejeon (KR); Min Su Cho, Daejeon (KR)

(73) Assignee: LG Energy Solution, Ltd.

( * ) Notice: Subject to any disclaimer, the term of this patent is extended or adjusted under 35 U.S.C. 154(b) by 254 days.

(21) Appl. No.: 16/618,558

(22) PCT Filed: Dec. 6, 2018

(86) PCT No.: PCT/KR2018/015434
§ 371 (c)(1),
(2) Date: Dec. 2, 2019

(87) PCT Pub. No.: WO2019/112343
PCT Pub. Date: Jun. 13, 2019

(65) Prior Publication Data
US 2020/0091566 A1    Mar. 19, 2020

(30) Foreign Application Priority Data

Dec. 6, 2017 (KR) .......................... 10-2017-0166659
Dec. 6, 2018 (KR) .......................... 10-2018-0155850

(51) Int. Cl.
*H01M 10/46* (2006.01)
*H02N 2/18* (2006.01)
*H01M 50/107* (2021.01)

(52) U.S. Cl.
CPC ......... *H01M 10/46* (2013.01); *H01M 50/107* (2021.01); *H02N 2/186* (2013.01)

(58) Field of Classification Search
CPC .......... H01M 50/107; H01M 10/0422; H01M 10/123; H01M 10/46; H01M 10/643; H02N 2/186
See application file for complete search history.

(56) References Cited

U.S. PATENT DOCUMENTS 7,595,128 B2    9/2009  Lee et al.
9,118,090 B2    8/2015  Lee et al.
(Continued)

FOREIGN PATENT DOCUMENTS

CN    203039044 U    7/2013
CN    203039415 U    7/2013
(Continued)

OTHER PUBLICATIONS

DE102008006920 English translation. Lachmund. Germany. Jul. 30, 2009. (Year: 2009).*
(Continued)

*Primary Examiner* — Christopher P Domone
(74) *Attorney, Agent, or Firm* — Lerner, David, Littenberg, Krumholz & Mentlik, LLP

(57) ABSTRACT

A cylindrical secondary battery includes a jelly-roll type electrode assembly having a structure in which a long sheet type positive electrode and a long sheet type negative electrode are wound with a separator interposed between the positive electrode and the negative electrode. The cylindrical secondary battery also includes a cylindrical battery case configured to receive the jelly-roll type electrode assembly, and a piezoelectric element configured to generate electrical energy due to the volumetric expansion of the jelly-roll type electrode assembly caused by charging and discharging the jelly-roll type electrode assembly.

18 Claims, 5 Drawing Sheets

(56) References Cited

U.S. PATENT DOCUMENTS

| | | | |
|---|---|---|---|
| 9,231,241 | B2 | 1/2016 | Kim et al. |
| 9,923,197 | B2 | 3/2018 | Lee et al. |
| 2003/0027036 | A1 | 2/2003 | Emori et al. |
| 2007/0122691 | A1 | 5/2007 | Lee et al. |
| 2008/0143214 | A1* | 6/2008 | McNamara ............ A45D 40/00 310/318 |
| 2012/0256582 | A1 | 10/2012 | Kim et al. |
| 2012/0276427 | A1 | 11/2012 | Kim |
| 2012/0286719 | A1* | 11/2012 | Lee .................... H01M 10/425 320/103 |
| 2013/0316205 | A1 | 11/2013 | Kim et al. |
| 2013/0323554 | A1 | 12/2013 | Heubner et al. |
| 2014/0342192 | A1 | 11/2014 | Wang et al. |
| 2015/0353352 | A1* | 12/2015 | Lee ......................... H02N 2/18 29/25.35 |
| 2016/0072332 | A1 | 3/2016 | Liu et al. |
| 2016/0099463 | A1 | 4/2016 | Lee et al. |

FOREIGN PATENT DOCUMENTS

| | | | |
|---|---|---|---|
| CN | 103443985 A | | 12/2013 |
| CN | 103647105 A | | 3/2014 |
| CN | 104426426 A | | 3/2015 |
| DE | 102008006920 | * | 7/2009 |
| DE | 102008006920 A1 | | 7/2009 |
| JP | 2013251267 A | | 12/2013 |
| JP | 201727774 A | | 2/2017 |
| JP | 201798149 A | | 6/2017 |
| JP | 2017535061 A | | 11/2017 |
| KR | 19990063342 A | | 7/1999 |
| KR | 20070000231 A | | 1/2007 |
| KR | 20070056494 A | | 6/2007 |
| KR | 20120121220 A | | 11/2012 |
| KR | 20120126624 A | | 11/2012 |
| KR | 101254881 B1 | | 4/2013 |
| KR | 101261705 B1 | | 5/2013 |
| KR | 20140065049 A | | 5/2014 |
| KR | 101449746 B1 | | 10/2014 |
| KR | 20150046560 A | | 4/2015 |
| KR | 20160040046 A | | 4/2016 |
| KR | 101708456 B1 | | 2/2017 |

OTHER PUBLICATIONS

International Search Report from Application No. PCT/KR2018/015434 dated Apr. 8, 2019, 2 pages.

Extended European Search Report including Written Opinion for Application No. EP18886346.8 dated Jun. 30, 2020.

Search Report dated Apr. 2, 2022 from the Office Action for Chinese Application No. 201880035170.X dated Apr. 12, 2022, 3 pages. [See p. 2, categorizing the cited references].

* cited by examiner

[FIG. 1]
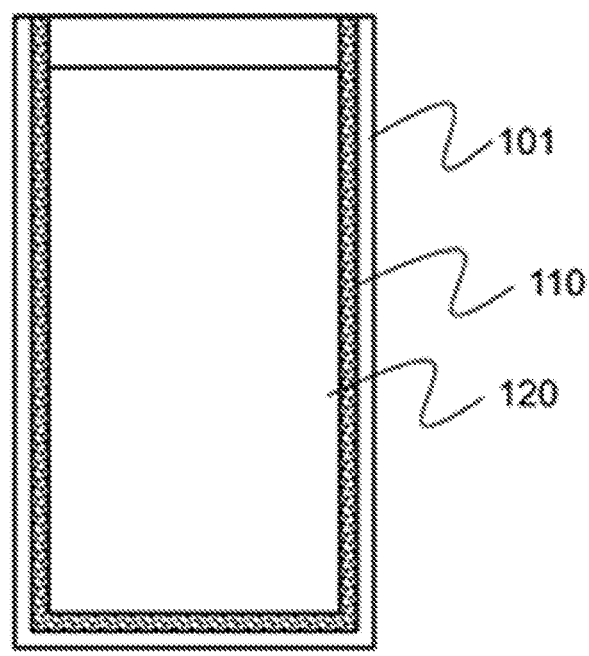

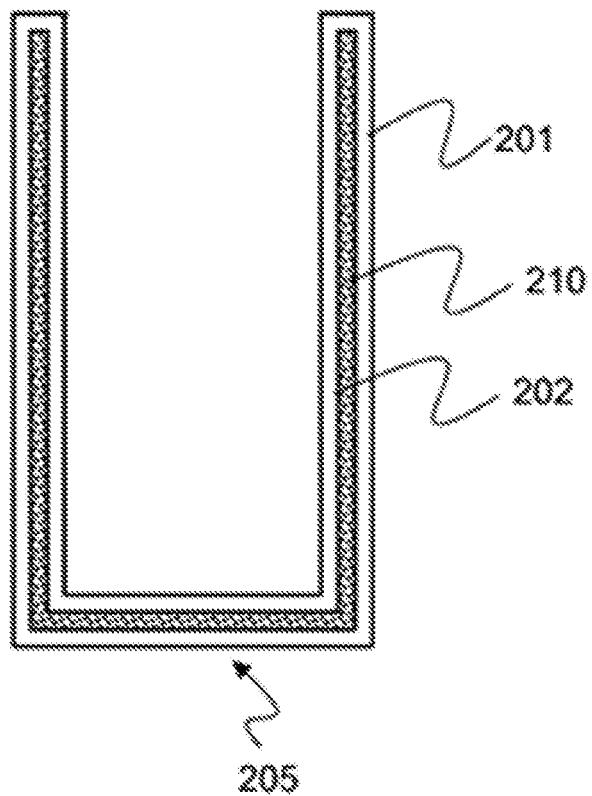

【FIG. 3】
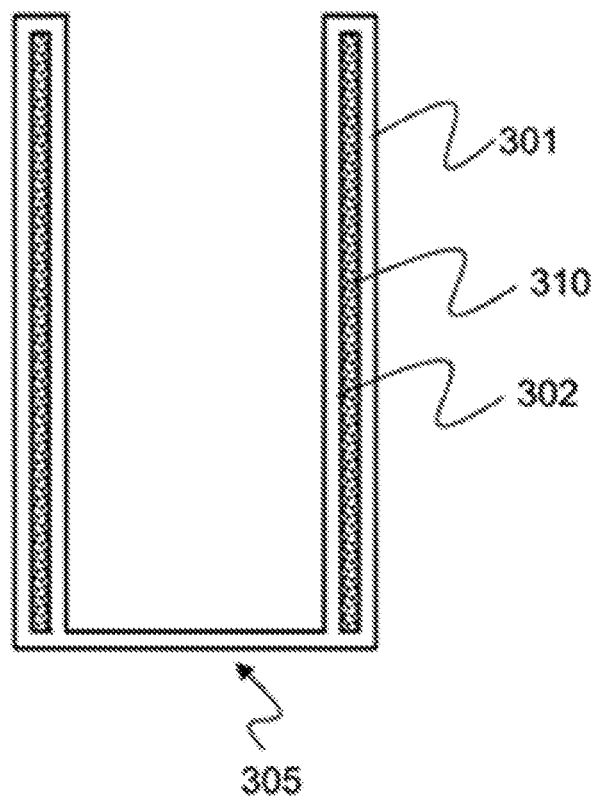

【FIG. 4】
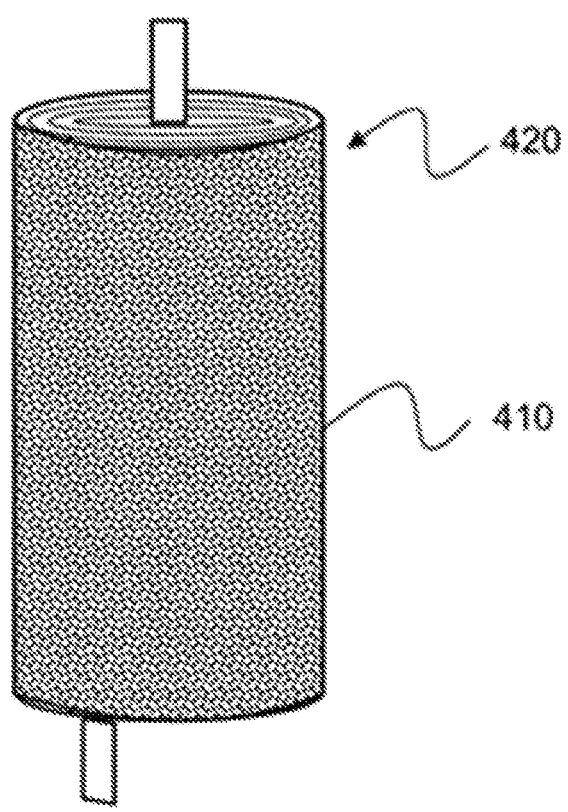

【FIG. 5】
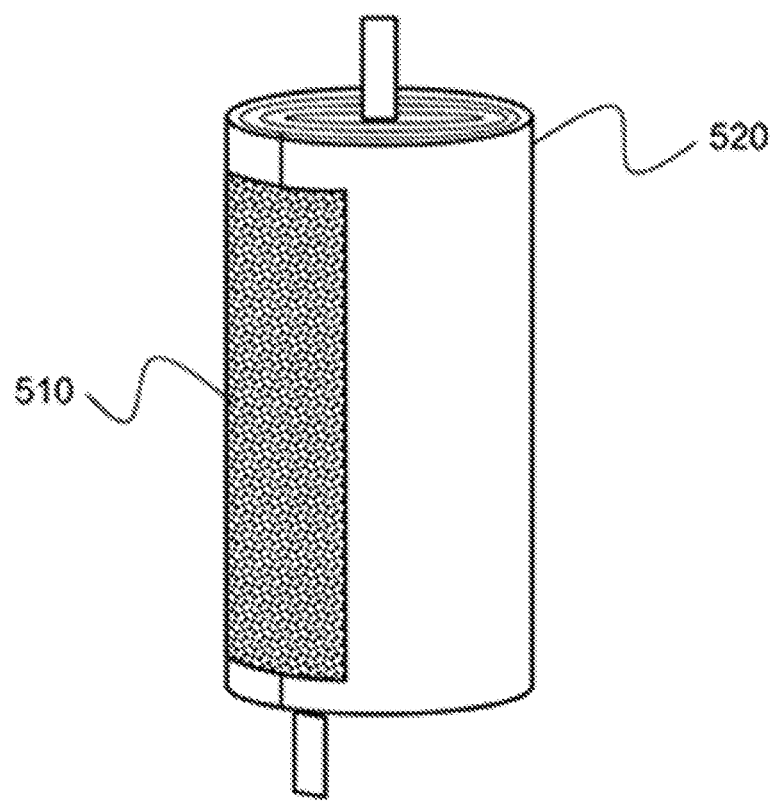

CYLINDRICAL SECONDARY BATTERY HAVING PIEZOELECTRIC ELEMENT DISPOSED THEREIN

CROSS-REFERENCE TO RELATED APPLICATIONS

This application is a national phase entry under 35 U.S.C. § 371 of International Application No. PCT/KR2018/015434 filed Dec. 6, 2018, which claims priority from Korean Patent Application No. 10-2017-0166659 filed on Dec. 6, 2017, and 10-2018-0155850 filed on Dec. 6, 2018, the disclosures of which are incorporated herein by reference in their entirety.

TECHNICAL FIELD

The present invention relates to a cylindrical secondary battery having a piezoelectric element disposed therein, and more particularly to a cylindrical secondary battery including a jelly-roll type electrode assembly mounted in a cylindrical battery case and a piezoelectric element for generating electrical energy due to the volumetric expansion of the jelly-roll type electrode assembly caused by charging and discharging the jelly-roll type electrode assembly.

BACKGROUND ART

As mobile devices have been continuously developed and the demand for mobile devices has increased, secondary batteries, which are capable of being charged and discharged, have been widely used as energy sources for mobile devices. In addition, secondary batteries have attracted considerable attention as energy sources for electric vehicles and hybrid electric vehicles, which have been developed to solve problems, such as air pollution, caused by existing gasoline and diesel vehicles using fossil fuels.

In general, based on the shape of a battery case, secondary batteries are classified into a cylindrical battery having an electrode assembly mounted in a cylindrical metal can, a prismatic battery having an electrode assembly mounted in a prismatic metal can, and a pouch-shaped battery having an electrode assembly mounted in a pouch-shaped case made of an aluminum laminate sheet.

The electrode assembly, which is mounted in the battery case, is a power generating element that includes a positive electrode, a negative electrode, and a separator that is interposed between the positive electrode and the negative electrode and that can be charged and discharged. The electrode assembly is classified as a jelly-roll type electrode assembly or a stacked type electrode assembly. A jelly-roll type electrode assembly is configured to have a structure in which a long sheet type positive electrode and a long sheet type negative electrode, to which active materials are applied, are wound with a separator disposed between the positive electrode and the negative electrode. A stacked type electrode assembly is configured to have a structure in which a plurality of positive electrodes having a predetermined size and a plurality of negative electrodes having a predetermined size are sequentially stacked with separators disposed respectively between the positive electrodes and the negative electrodes. The jelly-roll type electrode assembly has advantages in that it is easy to manufacture the jelly-roll type electrode assembly and the jelly-roll type electrode assembly has high energy density per unit weight. Consequently, the jelly-roll type electrode assembly has been widely used in fields to which it is necessary to apply high-capacity secondary batteries.

That is, a cylindrical battery having the jelly-roll type electrode assembly received in a cylindrical battery case has been used in order to satisfy the demand for a battery having high energy density and high capacity. Since the cylindrical battery uses a metal can, which exhibits higher rigidity than a pouch-shaped battery, as a battery case, it is difficult to increase the size of space defined in the battery. It is difficult to increase the energy density of the cylindrical battery and to improve the energy efficiency of the cylindrical battery, unless a material having high energy efficiency is developed in the state in which the utilization of the space defined in the cylindrical battery is not satisfactory, as described above.

Korean Registered Patent No. 1261705 discloses a pouch-shaped battery including a battery case having a piezoelectric element layer and a protection circuit module having a voltage storage unit, wherein the piezoelectric element layer converts absorbed vibration into voltage, which is stored in the voltage storage unit such that self-charging is possible when necessary.

However, the above secondary battery is a pouch-shaped battery, which is different from the cylindrical battery, and a separate member, such as the voltage storage unit, is further included in order to store electricity generated by the piezoelectric element layer, which decreases the efficiency of utilization of the space defined in the battery.

Korean Registered Patent No. 1708456 discloses a capacitor charging system including a piezoelectric element for producing electric power using the pressure generated by the phenomenon in which battery cells swell and a capacitor connected to the piezoelectric element for receiving the electric power for charging. Since the piezoelectric element is located between the battery cells or between the battery cells and a module case, it is difficult to apply the piezoelectric element to the interior of the cylindrical battery.

In the case in which a cylindrical battery having high energy density per unit weight is used, therefore, there is an urgent necessity for technology that enables the battery to perform self-charging without increasing the size of the battery and without requiring a separate storage space.

DISCLOSURE

Technical Problem

The present invention has been made in view of the above problems and other technical problems that have yet to be resolved, and it is an object of the present invention to provide a cylindrical secondary battery including a piezoelectric element for generating electrical energy due to the volumetric expansion of a jelly-roll type electrode assembly caused by charging and discharging the jelly-roll type electrode assembly such that the cylindrical secondary battery performs autonomous power generation, wherein it is possible to further produce electrical energy, in addition to the electricity generated by charging the jelly-roll type electrode assembly received in the cylindrical secondary battery.

Technical Solution

In accordance with an aspect of the present invention, the above and other objects can be accomplished by the provision of a cylindrical secondary battery including a jelly-roll type electrode assembly having a structure in which a long sheet type positive electrode and a long sheet type negative electrode are wound with a separator interposed between the positive electrode and the negative electrode; a cylindrical battery case configured to receive the jelly-roll type electrode assembly; and a piezoelectric element configured to generate electrical energy due to the volumetric expansion of the jelly-roll type electrode assembly caused by charging and discharging the jelly-roll type electrode assembly.

That is, the cylindrical secondary battery according to the present invention uses a jelly-roll type electrode assembly that is capable of being repeatedly charged and discharged. Consequently, it is possible to obtain electrical energy as the result of charging the electrode assembly. Meanwhile, in order to satisfy the demand for a battery having high capacity and high energy density, various efforts have been made to improve the energy density of the cylindrical secondary battery. However, a long time is necessary to develop a material that exhibits high energy efficiency.

According to the present invention, the piezoelectric element is included in the cylindrical secondary battery, and the piezoelectric element generates energy due to the volumetric change of the jelly-roll type electrode assembly, which repeatedly expands and contracts during charging and discharging of the electrode assembly.

Consequently, the present invention has an advantage in that it is possible for the secondary battery to perform autonomous power generation while being used.

The piezoelectric element is a material which loses the balance between positive charges and negative charges when pressure is applied to it, whereby a potential difference occurs and thus electricity is produced. When pressure is applied to the piezoelectric element as the result of expansion of the jelly-roll type electrode assembly, electrical energy is generated.

According to the present invention, as described above, it is possible to generate electrical energy using the piezoelectric element, in addition to the electricity generated by charging the jelly-roll type electrode assembly. Consequently, it is possible to provide a cylindrical secondary battery having high energy density without increasing the overall size of the secondary battery.

In a concrete example, the piezoelectric element may be added to the cylindrical secondary battery so as not to increase the overall volume of the cylindrical secondary battery. Considering the position of the piezoelectric element at which electrical energy can be generated due to the volumetric expansion of the jelly-roll type electrode assembly, it is preferable for the piezoelectric element to be added to the inside of the battery case. For example, the piezoelectric element may be located between the jelly-roll type electrode assembly and the cylindrical battery case.

In the case in which the piezoelectric element is disposed in contact with the jelly-roll type electrode assembly, which repeatedly expands and contracts during charging and discharging thereof, as described above, or in the case in which the piezoelectric element is disposed adjacent to the jelly-roll type electrode assembly, pressure may be more accurately applied to the piezoelectric element, and the piezoelectric element may be added to a relatively large area, whereby it is possible to increase the amount of electrical energy that is generated by the piezoelectric element.

The area and position to which the piezoelectric element is added may be selectively applied. For example, the piezoelectric element may be added to a tape configured to prevent the jelly-roll type electrode assembly from loosening. In the case in which the piezoelectric element is added to the above position, it is possible to prevent the wound state of the jelly-roll type electrode assembly from being loosened due to repetitive expansion and contraction of the jelly-roll type electrode assembly and to additionally produce electrical energy due to the piezoelectric element.

In addition, the piezoelectric element may be attached to the inner surface of the cylindrical battery case. The piezoelectric element may be attached to the entire inner surface of the battery case, or may be attached only to the cylindrical side surface of the battery case.

The piezoelectric element may be added in the form of a tape having an adhesive layer formed on the surface that is opposite the battery case, or may be added using a spraying method.

In a concrete example, the cylindrical battery case may include an outer case and an inner case, between which a hollow portion is defined, and the piezoelectric element may be located in the hollow portion. That is, the entirety of the cylindrical battery case including the cylindrical surface and the lower surface of the battery case may be configured to have a structure including an outer case and an inner case.

Meanwhile, when considering the fact that the jelly-roll type electrode assembly expands from the winding center axis thereof in the centrifugal direction, the cylindrical battery case may be configured such that the cylindrical side surface of the cylindrical battery case has a dual structure including an outer case and an inner case and such that the lower surface of the cylindrical battery case has a single structure, whereby the piezoelectric element may be added only to the cylindrical side surface of the cylindrical battery case.

The piezoelectric element may be at least one selected from the group consisting of a natural piezoelectric material, an artificial piezoelectric crystal, lead-free piezoelectric ceramics, and artificial piezoelectric ceramics.

Specifically, the natural piezoelectric material may be berlinite ($AlPO_4$), sucrose, quartz, Rochelle salt, topaz, tourmaline, silk, enamel, or dentine; the artificial piezoelectric crystal may be gallium phosphate ($GaPO_4$) or langasite ($La_3Ga_5SiO_{14}$); and the lead-free piezoelectric ceramics may be NaKNb, bismuth ferrite ($BiFeO_3$), sodium niobate ($NaNbO_3$), $Bi_4Ti_3O_{12}$, or $Na_{0.5}Bi_{0.5}TiO_3$.

The artificial piezoelectric ceramics are barium titanate ($BaTiO_3$), lead titanate ($PbTiO_3$), potassium niobate ($KNbO_3$), lithium niobate ($LiNbO_3$), lithium tantalate ($LiTaO_3$), sodium tungstate ($Na_2WO$), zinc oxide ($ZnO_3$), $Ba_2NaNb_5O_5$, or $Pb_2KNb_5O_{15}$.

In a concrete example, the electrical energy generated by the piezoelectric element may be stored in the jelly-roll type electrode assembly. Since no separate member for storing the electrical energy generated by the piezoelectric element is included, it is possible to provide a cylindrical secondary battery having high energy density per unit volume.

In accordance with another aspect of the present invention, there is provided a battery pack including the cylindrical secondary battery.

Specifically, the battery pack may be used as a power source for a device requiring the ability to withstand high temperatures, a long lifespan, high rate characteristics, etc. Specific examples of the device may include a mobile electronic device, a wearable electronic device, a power tool driven by a battery-powered motor, an electric automobile, such as an electric vehicle (EV), a hybrid electric vehicle (HEV), or a plug-in hybrid electric vehicle (PHEV), an electric two-wheeled vehicle, such as an electric bicycle (E-bike) or an electric scooter (E-scooter), an electric golf cart, and an energy storage system. However, the present invention is not limited thereto.

The structure and manufacturing method of the device are well known in the art to which the present invention pertains, and thus a detailed description thereof will be omitted.

BRIEF DESCRIPTION OF DRAWINGS

FIG. 1 is a vertical sectional view showing a cylindrical secondary battery according to an embodiment of the present invention.

FIG. 2 is a vertical sectional view showing a cylindrical battery case according to an embodiment of the present invention.

FIG. 3 is a vertical sectional view showing a cylindrical battery case according to another embodiment of the present invention.

FIG. 4 is a perspective view showing a jelly-roll type electrode assembly according to an embodiment of the present invention.

FIG. 5 is a perspective view showing a jelly-roll type electrode assembly according to another embodiment of the present invention.

BEST MODE

Now, preferred embodiments of the present invention will be described in detail with reference to the accompanying drawings such that the preferred embodiments of the present invention can be easily implemented by a person having ordinary skill in the art to which the present invention pertains. In describing the principle of operation of the preferred embodiments of the present invention in detail, however, a detailed description of known functions and configurations incorporated herein will be omitted when the same may obscure the subject matter of the present invention.

Wherever possible, the same reference numbers will be used throughout the drawings to refer to parts that perform similar functions or operations. Meanwhile, in the case in which one part is said to be 'connected' to another part in the following description of the present invention, not only may the one part be directly connected to the another part, but also, the one part may be indirectly connected to the another part via a further part. In addition, that a certain element is 'included' does not mean that other elements are excluded, but means that such elements may be further included unless mentioned otherwise.

Reference will now be made in detail to the preferred embodiments of the present invention, examples of which are illustrated in the accompanying drawings.

FIG. 1 is a vertical sectional view schematically showing a cylindrical secondary battery according to an embodiment of the present invention.

Referring to FIG. 1, the cylindrical secondary battery, denoted by reference numeral 100, is configured to have a structure including a battery case 101, which has a cylindrical single-layered structure having a closed bottom and an open top, an electrode assembly 120 received in the battery case 101, and a piezoelectric element 110 disposed between the battery case 101 and the electrode assembly 120. The piezoelectric element 110 is also interposed between the lower surface of the battery case 101 and the electrode assembly 120. Alternatively, the piezoelectric element 110 may be interposed only between the side surface of the battery case 101 and the side surface of the electrode assembly 120.

For convenience of description, other internal elements constituting the cylindrical secondary battery are omitted from the figure.

FIGS. 2 and 3 are vertical sectional views schematically showing cylindrical battery cases according to different embodiments of the present invention.

Referring to FIGS. 2 and 3, each of the battery cases, denoted by reference numerals 200 and 300, is configured to have a cylindrical dual structure having a closed bottom and an open top.

The battery case 200 includes an outer case 201 and an inner case 202. A hollow portion is defined between the outer case 201 and the inner case 202, and a piezoelectric element 210 is disposed in the hollow portion. Each of the side surface and the lower surface 205 of the battery case 200 includes an outer case 201 and an inner case 202.

The battery case 300 includes an outer case 301 and an inner case 302. A hollow portion is defined between the outer case 301 and the inner case 302, and a piezoelectric element 310 is disposed in the hollow portion. The side surface of the battery case 300 includes an outer case 301 and an inner case 302, but the lower surface 305 of the battery case 300 is configured to have a single layer.

FIG. 4 is a perspective view showing a jelly-roll type electrode assembly according to an embodiment of the present invention, and FIG. 5 is a perspective view showing a jelly-roll type electrode assembly according to another embodiment of the present invention.

Referring to FIG. 4, the jelly-roll type electrode assembly, denoted by reference numeral 420, is shown in the state in which a piezoelectric element 410 is added to the entire outer surface of a sheet type electrode, which is wound. As shown, the piezoelectric element 410 may be added so as to completely surround the outer surface of the jelly-roll type electrode assembly, extending around all 360 degrees of the outer circumference. Alternatively, the length of the piezoelectric element may be shorter, extending less than 360 degrees around the outer circumference.

Referring to FIG. 5, the jelly-roll type electrode assembly, denoted by reference numeral 520, is shown in the state in which a piezoelectric element 510 is added to a tape attached to the winding end of the electrode assembly in order to prevent loosening of the electrode assembly. In this case, it is preferable to receive the jelly-roll type electrode assembly in a battery case having a piezoelectric element attached to the inner surface thereof, such as the cylindrical secondary battery 100 shown in FIG. 1, in order to increase the size of the piezoelectric element.

In the case of the piezoelectric elements shown in FIGS. 1, 2, and 3, each of the battery cases 101, 200, and 300 corresponds to a negative electrode, and therefore a negative (−) pole of the piezoelectric element may be directly connected to each of the battery cases 101, 200, and 300. A positive (+) pole of the piezoelectric element may be connected to a positive (+) pole of a top cap of the cylindrical battery, or may be connected to a positive (+) electrode tab of the electrode assembly in parallel therewith.

In the case of the piezoelectric element shown in FIG. 4 or 5, a positive (+) pole and a negative (−) pole of the piezoelectric element may be directly connected to a positive electrode tab and a negative electrode tab of the jelly-roll type electrode assembly 420 or 520 in parallel therewith.

As described above, the cylindrical secondary battery according to the present invention is configured to have a structure including a jelly-roll type electrode assembly and/or a piezoelectric element disposed in the battery case. When the jelly-roll type electrode assembly expands during charging and discharging of the secondary battery, therefore, pressure is applied to the piezoelectric element. Consequently, a potential difference is formed, whereby electrical energy may be produced.

In addition, since expansion and contraction of the jelly-roll type electrode assembly are repeated, pressure may be repeatedly applied to the piezoelectric element. Consequently, electrical energy may be repeatedly produced by the piezoelectric element according to the charging and discharging cycles of the secondary battery.

Hereinafter, the present invention will be described with reference to the following example. This example is provided only for easier understanding of the present invention and should not be construed as limiting the scope of the present invention.

Example

A cylindrical secondary battery, configured such that the lower surface of a battery case is configured to have a single layer, the side surface of the battery case includes an outer case and an inner case, between which a hollow portion is defined, and a piezoelectric element is disposed in the hollow portion, as shown in FIG. 3, was manufactured.

The cylindrical secondary battery is of type 18650. That is, the outer diameter of the cylindrical secondary battery is 18 mm, the height of the cylindrical secondary battery is 65 mm, and the height of the side surface of the battery case, in which the piezoelectric element is disposed, excluding the height of a cap assembly, which is located at the upper part of the cylindrical secondary battery, is 60 mm.

In the case in which the thickness of the battery case is 0.15 mm and the thicknesses of the outer case, the inner case, and the hollow portion are 0.05 mm, 0.05 mm, and 0.05 mm, respectively, the volume of the portion of the battery case in which the piezoelectric element is disposed may be calculated as follows.

$$V = 3.14 \times 18 \text{ mm} \times 0.05 \text{ mm} \times 60 \text{ mm} \times 1 \text{ cm}^3/1000 \text{ mm}^3 = 0.16956 \text{ cm}^3$$

In general, the energy density of the piezoelectric element when pressure is applied thereto is 250 $\mu W/cm^3$. For the above battery case, therefore, it is possible to obtain an energy of 250 $\mu W/cm^3 \times 0.169560$ cm$^3$=42.39 $\mu W$=0.42390 mW.

In the case in which the cylindrical secondary battery according to the present invention is used, as described above, it is possible to produce electrical energy due to the physical volumetric expansion of the electrode assembly, in addition to the energy generated by electrically charging the secondary battery. Consequently, it is possible to provide a cylindrical secondary battery having improved energy density without increasing the size of a battery cell.

Those skilled in the art to which the present invention pertains will appreciate that various applications and modifications are possible based on the above description without departing from the scope of the present invention.

DESCRIPTION OF REFERENCE NUMERALS

100: Cylindrical secondary battery
101, 200, 300: Battery cases
110, 210, 310, 410, 510: Piezoelectric elements
120, 420, 520: Electrode assemblies
201, 301: Outer cases
202, 302: Inner cases
205, 305: Lower surfaces of battery cases

INDUSTRIAL APPLICABILITY

As is apparent from the above description, a cylindrical secondary battery according to the present invention is configured to have a structure in which a piezoelectric element, which produces electrical energy due to the volumetric expansion of a jelly-roll type electrode assembly caused by charging and discharging the jelly-roll type electrode assembly, is added to the jelly-roll type electrode assembly or to a battery case. Consequently, it is possible to provide a cylindrical secondary battery that is capable of performing autonomous power generation, in addition to the electrical energy generated as the result of charging the secondary battery, whereby the energy density of the secondary battery is remarkably improved.

The piezoelectric element according to the present invention inhibits charging and discharging of the electrode assembly. Consequently, it is possible to prevent the electrode assembly from being deformed due to charging and discharging of the electrode assembly.

In addition, the electrical energy generated due to the autonomous power generation using the piezoelectric element is stored in the jelly-roll type electrode assembly, whereby no additional storage space is needed. Consequently, it is possible to solve a problem in which the energy density per unit volume of the cylindrical secondary battery is reduced due to an increase in the volume of the cylindrical secondary battery.

The invention claimed is:

1. A cylindrical secondary battery comprising:
   a jelly-roll type electrode assembly having a structure in which a long sheet type positive electrode and a long sheet type negative electrode are wound with a separator interposed between the positive electrode and the negative electrode;
   a cylindrical battery case configured to receive the jelly-roll type electrode assembly; and
   a piezoelectric element configured to generate electrical energy due to a volumetric expansion of the jelly-roll type electrode assembly caused by charging and discharging the jelly-roll type electrode assembly,
   wherein the cylindrical secondary battery is configured to store the electrical energy generated by the piezoelectric element in the jelly-roll type electrode assembly.

2. The cylindrical secondary battery according to claim 1, wherein the piezoelectric element is located between the jelly-roll type electrode assembly and the cylindrical battery case.

3. The cylindrical secondary battery according to claim 2, wherein the piezoelectric element is included on a tape configured to prevent loosening of the jelly-roll type electrode assembly.

4. The cylindrical secondary battery according to claim 2, wherein the piezoelectric element is attached to an inner surface of the cylindrical battery case.

5. The cylindrical secondary battery according to claim 1, wherein
   the cylindrical battery case comprises an outer case and an inner case, between which a hollow portion is defined, and
   the piezoelectric element is located in the hollow portion.

6. The cylindrical secondary battery according to claim 5, wherein the cylindrical battery case is configured such that a cylindrical side surface of the cylindrical battery case has a dual-walled structure defined by the outer case and the inner case, and such that a lower surface of the cylindrical battery case has a single-walled structure.

7. The cylindrical secondary battery according to claim 1, wherein the piezoelectric element is at least one selected from a group consisting of a natural piezoelectric material, an artificial piezoelectric crystal, lead-free piezoelectric ceramics, and artificial piezoelectric ceramics.

8. The cylindrical secondary battery according to claim 7, wherein the piezoelectric element is a natural piezoelectric material selected from a group consisting of berlinite ($AlPO_4$), sucrose, quartz, Rochelle salt, topaz, tourmaline, silk, enamel, and dentine.

9. The cylindrical secondary battery according to claim 7, wherein the piezoelectric element is an artificial piezoelectric crystal selected from a group consisting of gallium phosphate ($GaPO_4$) and langasite ($La_3Ga_5SiO_{14}$).

10. The cylindrical secondary battery according to claim 7, wherein the piezoelectric element comprises lead-free piezoelectric ceramics selected from a group consisting of NaKNb, bismuth ferrite ($BiFeO_3$), sodium niobate ($NaNbO_3$), $Bi_4Ti_3O_{12}$, and $Na_{0.5}Bi_{0.5}TiO_3$.

11. The cylindrical secondary battery according to claim 7, wherein the piezoelectric element comprises artificial piezoelectric ceramics selected from a group consisting of barium titanate ($BaTiO_3$), lead titanate ($PbTiO_3$), potassium niobate ($KNbO_3$), lithium niobate ($LiNbO_3$), lithium tantalate ($LiTaO_3$), sodium tungstate ($Na_2WO$), zinc oxide ($ZnO_3$), $Ba_2NaNb_5O_5$, and $Pb_2KNb_5O_{15}$.

12. A battery pack comprising the cylindrical secondary battery according to claim 1.

13. A cylindrical secondary battery comprising:
a jelly-roll type electrode assembly having a structure in which a long sheet type positive electrode and a long sheet type negative electrode are wound with a separator interposed between the positive electrode and the negative electrode;
a cylindrical battery case configured to receive the jelly-roll type electrode assembly; and
a piezoelectric element configured to generate electrical energy due to a volumetric expansion of the jelly-roll type electrode assembly caused by charging and discharging the jelly-roll type electrode assembly, wherein the piezoelectric element is located between the jelly-roll type electrode assembly and the cylindrical battery case, and wherein the piezoelectric element is included on a tape configured to prevent loosening of the jelly-roll type electrode assembly.

14. The cylindrical secondary battery according to claim 13, wherein the electrical energy generated by the piezoelectric element is stored in the jelly-roll type electrode assembly.

15. A battery pack comprising the cylindrical secondary battery according to claim 13.

16. A cylindrical secondary battery comprising:
a jelly-roll type electrode assembly having a structure in which a long sheet type positive electrode and a long sheet type negative electrode are wound with a separator interposed between the positive electrode and the negative electrode;
a cylindrical battery case configured to receive the jelly-roll type electrode assembly, the cylindrical battery case comprising an outer case and an inner case, between which a hollow portion is defined, wherein the cylindrical battery case is configured such that a cylindrical side surface of the cylindrical battery case has a dual-walled structure defined by the outer case and the inner case, and such that a lower surface of the cylindrical battery case has a single-walled structure; and
a piezoelectric element configured to generate electrical energy due to a volumetric expansion of the jelly-roll type electrode assembly caused by charging and discharging the jelly-roll type electrode assembly, wherein the piezoelectric element is located in the hollow portion.

17. The cylindrical secondary battery according to claim 16, wherein the electrical energy generated by the piezoelectric element is stored in the jelly-roll type electrode assembly.

18. A battery pack comprising the cylindrical secondary battery according to claim 16.

* * * * *